(12) United States Patent
Tsai

(10) Patent No.: US 6,232,197 B1
(45) Date of Patent: May 15, 2001

(54) METAL-INSULATOR-METAL CAPACITOR

(75) Inventor: Meng-Jin Tsai, Kao-Hsiung (TW)

(73) Assignee: United Microelectronics Corp,, Hsin-Chu (TW)

( * ) Notice: Subject to any disclaimer, the term of this patent is extended or adjusted under 35 U.S.C. 154(b) by 0 days.

(21) Appl. No.: 09/287,880

(22) Filed: Apr. 7, 1999

(51) Int. Cl.$^7$ ................................................. H01L 21/20
(52) U.S. Cl. ............................................ 438/393; 438/258
(58) Field of Search .................................... 438/243, 244, 438/240, 241, 250, 253, 396, 258

(56) References Cited

U.S. PATENT DOCUMENTS 5,624,864 * 4/1997 Arita et al. ................................ 437/3
6,081,021 * 6/2000 Gambino et al. ..................... 257/530

* cited by examiner

Primary Examiner—David Nelms
Assistant Examiner—Quoc Hoang

(57) ABSTRACT

A metal-insulator-metal capacitor for improved mixed-mode capacitor in a logic circuit of a semiconductor device is disclosed. The bottom electrode of the capacitor is polycide and the top electrode is metal formed by damascene technology. The middle layer of the capacitor is a dielectric layer formed by using a chemical vapor deposition method. The voltage coefficient of this capacitor is approximate to zero.

21 Claims, 4 Drawing Sheets

METAL-INSULATOR-METAL CAPACITOR

BACKGROUND OF THE INVENTION

1. Field of the Invention

The present invention relates to an embedded capacitor fabrication and, more particularly, to a method for forming a metal-insulator-metal capacitor in logic circuit.

2. Description of the Prior Art

In the field of integrated circuits, it is preferable to form circuit elements in the smallest achievable surface area in order to realize a high degree of circuit complexity into a small integrated circuit chip size, resulting in low cost per function. The mixed-mode process can provide a process flow with embedded capacitor in logic circuit. The addition of a capacitor can be used for an RC analog circuit or other special applications Referring to FIG. 1, a metal-oxide-semiconductor field effect transistor having a gate 14C, gate oxide 14D, drain 14B and source 14A is formed in and on a substrate 10. Further, a bottom electrode 20 of capacitor is formed on a field oxide region 12. Dielectric layer 21 and top electrode 22 are formed in sequence. Then, after interlevel dielectric layer 30 is formed on the semiconductor device, contact 32 is formed in the interlevel dielectric layer 30.

For a conventional mixed-mode process, the material of top electrode 22 and bottom electrode 20 is polysilicon. However, the polysilicon depletion will cause the different capacitance values under different bias voltage, as shown in FIG. 2.

SUMMARY OF THE INVENTION

In accordance with the present invention, a method is provided for forming a metal-insulator-metal capacitor that can effectively solve the unstable capacitance problem of poly capacitor.

It is another object of the present invention that the excellent global planarization can also be achieved with this method In one embodiment, the bottom electrode of the capacitor is formed on a field oxide region first. Then, an interlevel dielectric layer is deposited on the semiconductor device and a portion of the interlevel dielectric layer is then etched Next, having formed a dielectric layer of the capacitor on said bottom electrode, a metal layer is deposited on the dielectric layer Finally, the excess metal layer above the interlevel dielectric layer is removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
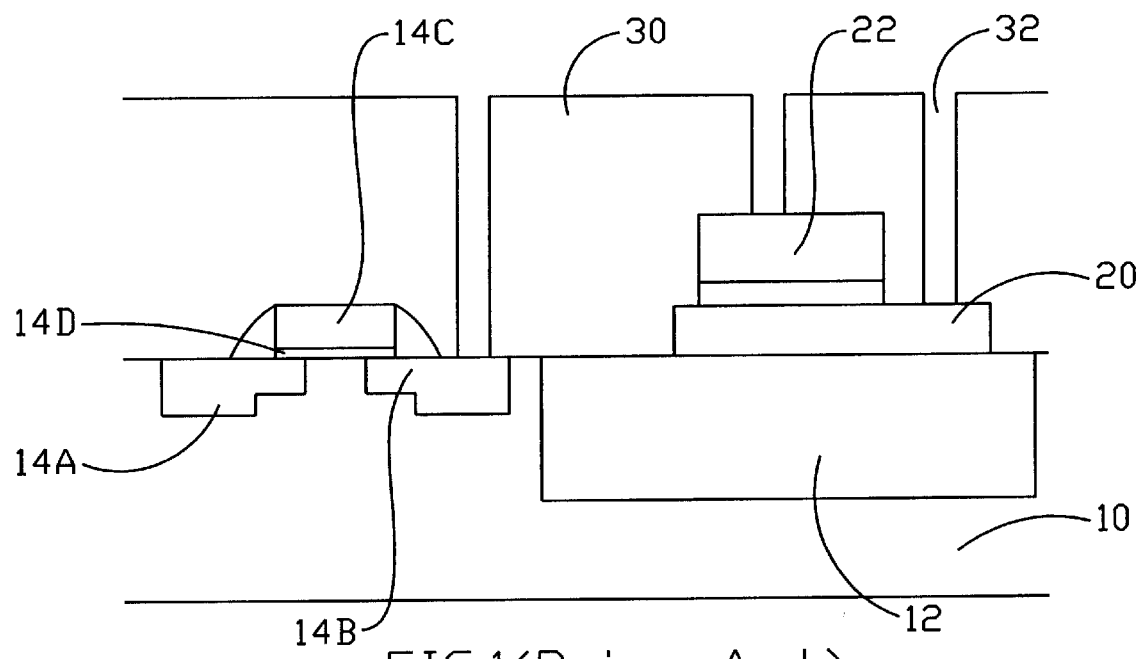
FIG. 1 shows a cross-sectional view illustrative of a traditional mixed-mode capacitor.
Figure 2:
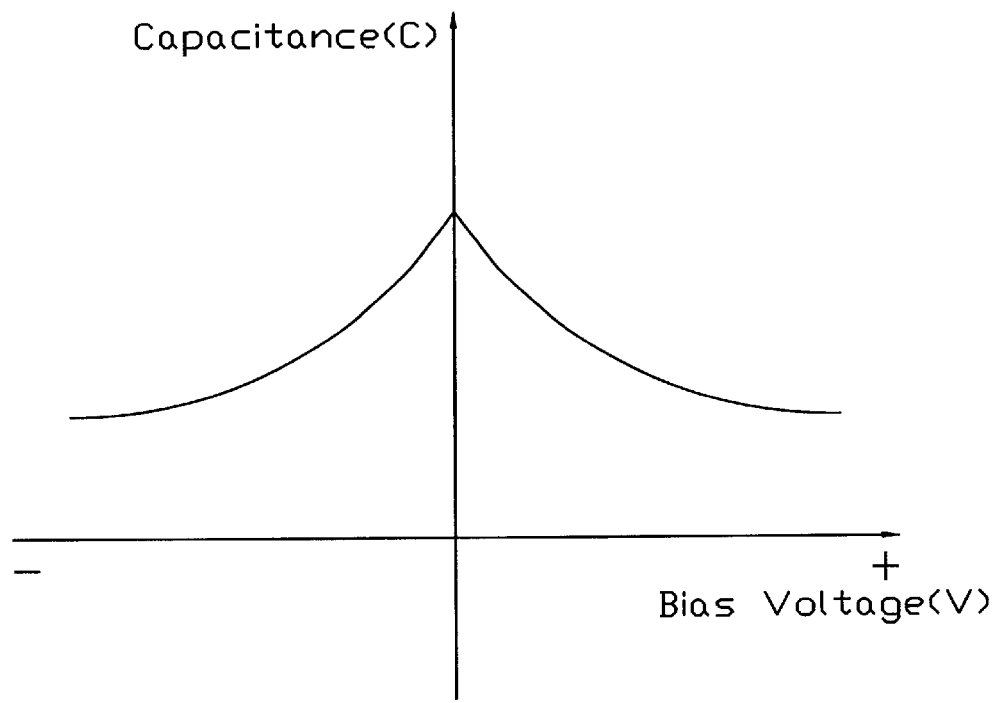
FIG. 2 shows a prior relationship diagram between capacitance and bias voltage.
Figure 3:
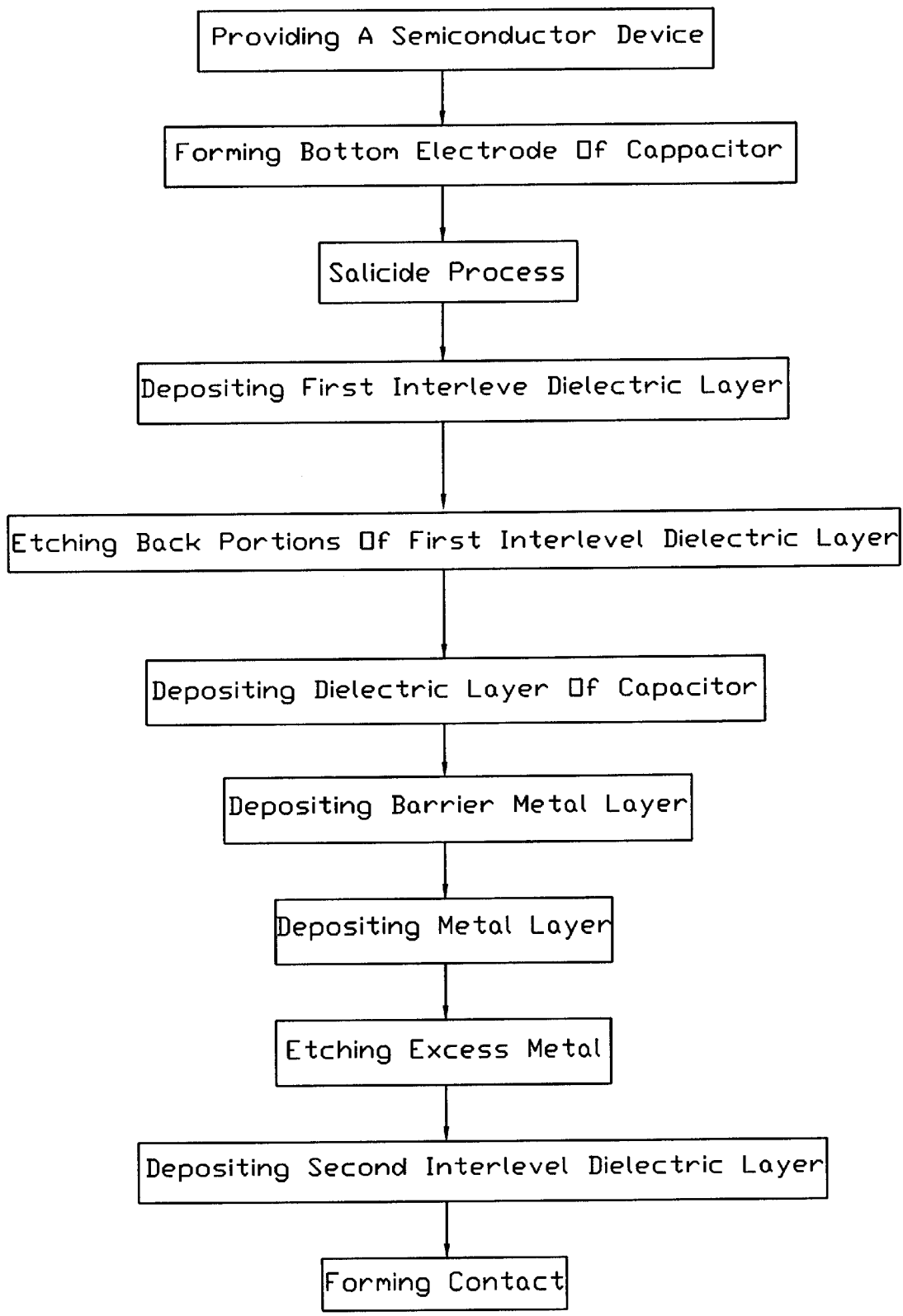
FIG. 3 is a flow diagram showing the steps for forming a metal-insulator-metal capacitor according to the present invention.

The following is the detailed description of this invention. Referring to FIG. 3, a flow diagram showing the steps for forming a metal-insulator-metal capacitor in accordance with this disclosure is shown First, a semiconductor device is provided and a metal-oxide-semiconductor field effect transistor is formed Then, after forming a bottom electrode of the capacitor on a field oxide region, a salicide process is performed A first interlevel dielectric layer is then formed on the semiconductor device Next, a portion of the first interlevel dielectric layer is etched back such that the dielectric layer of the capacitor can be formed on the bottom electrode. A barrier metal layer and metal layer are deposited in sequence and the excess metal layer is etched back by using chemical mechanical polishing to reach global planarization Then, a second interlevel dielectric layer having been deposited on the semiconductor device, contact is formed in the interlevel dielectric layers Suitable conditions for performing the various steps set forth in FIG. 3 are set forth below and will be explained by reference to FIGS. 4A to 4D.

Figure 4A:
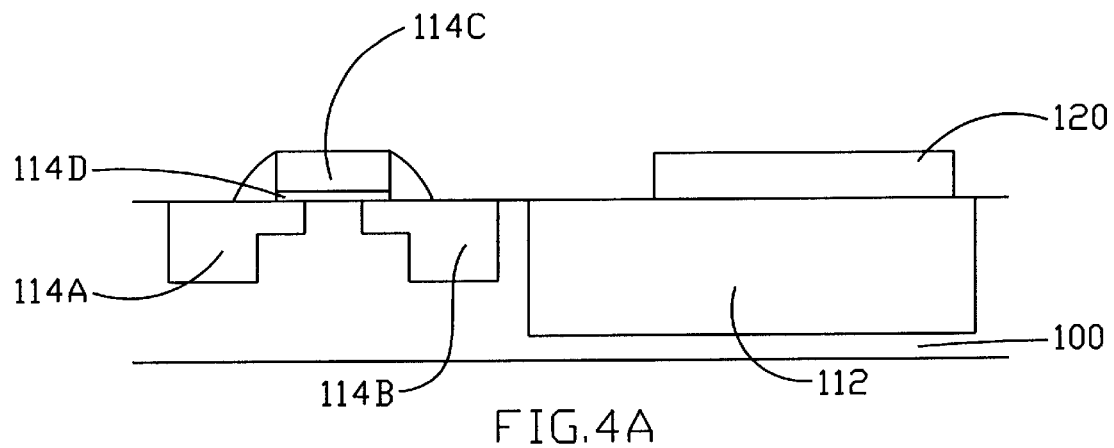
FIGS. 4A to 4D show cross-sectional views illustrative of various stages in the fabrication of a metal-insulator-metal capacitor according to the present invention.

Referring to FIG. 4A, a metal-oxide-semiconductor field effect transistor (MOSFET) having a gate 114C, a gate oxide 114D, a drain 114B and a source 114A is conventionally formed in and on the substrate 100. The field oxide region 112 under capacitor (formed by the following steps) is used for isolating the capacitor and transistor Another way to isolate the capacitor and transistor may use shallow trench isolation (STI). The field oxide region 112 is formed by using any conventional method such as thermal oxide process or Local Oxidation (LOCOS) process and the thickness of field oxide region 112 is about from 2000 to 6000 angstroms. A bottom electrode 120 is conventionally formed on the field oxide region 112 by depositing polysilicon and then via salicide process. The thickness of this bottom electrode 120 is about from 500 to 3000 angstroms.

Figure 4B:
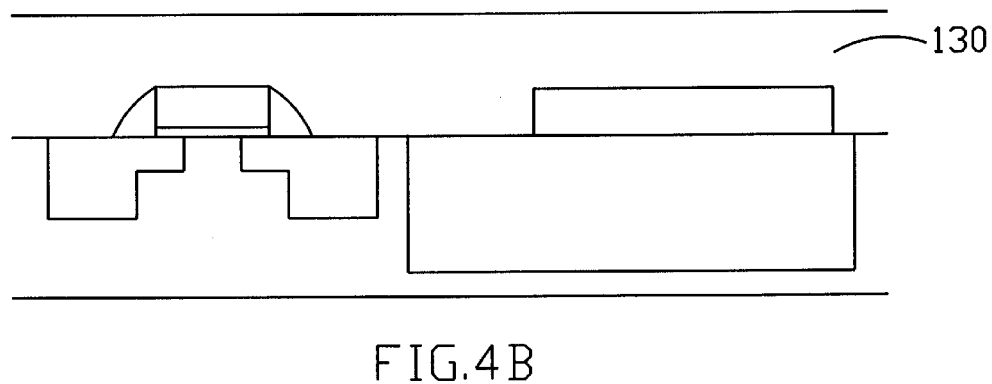

A first interlevel dielectric layer 130 is conventionally formed on the semiconductor device, as shown in FIG. 4B. Then, the interlevel dielectric layer 130 is global planarized by using a chemical mechanical polishing method. The following step is damascene technology to form top electrode of the capacitor.

Figure 4C:
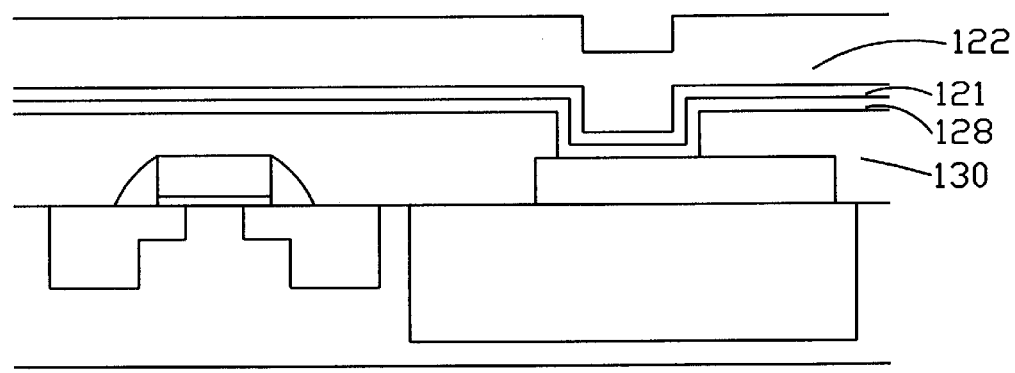

Referring to FIG. 4C, a portion of interlevel dielectric layer 130 is etched by using a conventional method Then, a dielectric layer 128 is formed first on the bottom electrode 120. The materials of the dielectric layer 128 may be silicon oxide, silicon nitride, silicon oxynitride, or tantalum oxide. Silicon oxide, silicon nitride and silicon oxynitride may be formed by using low pressure chemical vapor deposition (LPCVD) or plasma enhanced chemical vapor deposition (PECVD), and also may be formed by using high density plasma CVD. Moreover, tantalum oxide is also formed by using a conventional CVD method such as LPCVD. The thickness of this dielectric layer 128 is about from 100 to 500 angstroms.

Figure 4D:
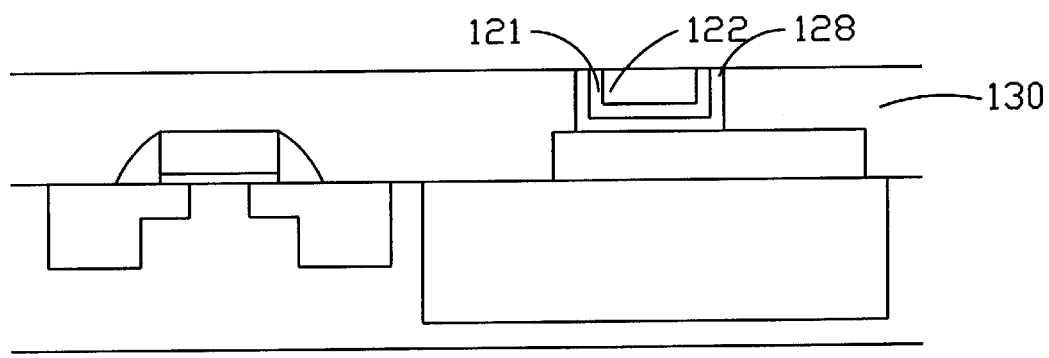

A barrier metal layer 121 is formed by using a conventional sputtering method. The materials of this layer 121 are titanium and titanium nitride (Ti/TiN). Then, a metal layer 122 is formed by using any suitable conventional method The materials of this layer 122 may be tungsten or copper. Referring to FIG. 4D, the excess metal layers 121 and 122 above interlevel dielectric layer 130 will be removed by using a conventional chemical mechanical polishing method.

Figure 4E:
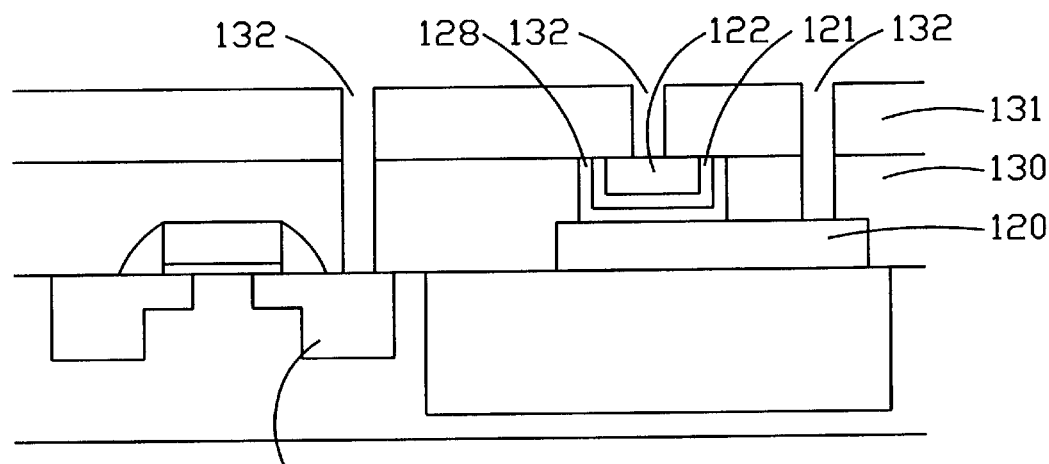

Referring to FIG. 4E, a second interlevel dielectric layer is formed on the semiconductor device by using the same method as the first interlevel dielectric layer 130. The thickness of this layer 131 is about 4000 to 40000 angstroms. Then, any suitable conventional methods that can form contact 132 in interlevel dielectric layers 130 and 131 are preformed to connect top electrode 122, bottom electrode 120 and drain 114B.

Figure 5:
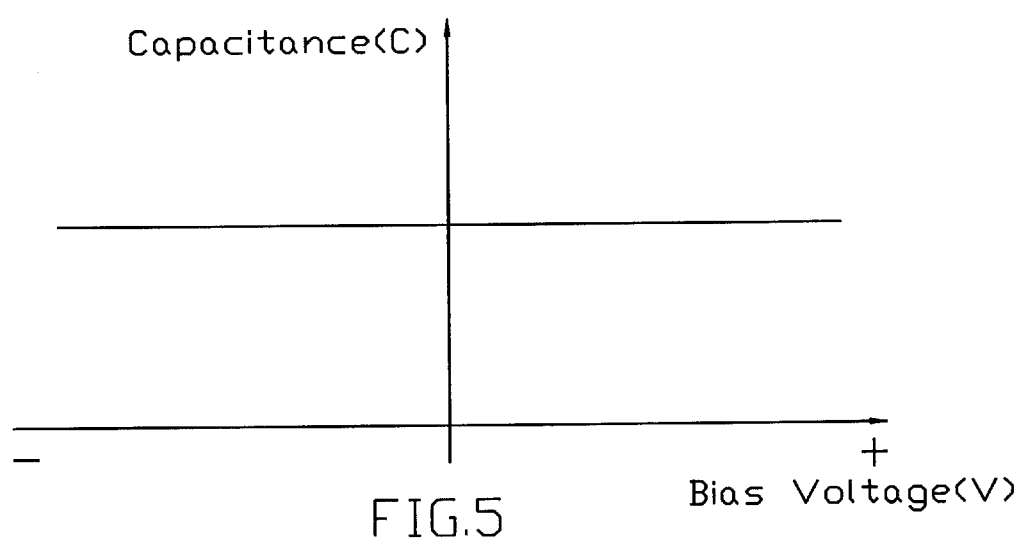
FIG. 5 shows a relationship diagram between capacitance value and bias voltage.

Referring to FIG. 5, a relationship diagram between capacitance value and bias voltage is shown. Because the material of the electrode in this capacitor is metal, no depletion is present and the capacitance value is approximate to constant under different bias voltages.

Although specific embodiments have been illustrated and described, it will be obvious to those skilled in the art that various modifications may be made without departing from what is intended to be limited solely by the appended claims.

What is claimed is:

1. A method for forming electrical charge storage apparatus in a mixed-mode process, said method comprising:
   providing a substrate with a field oxide region adjacent to a metal-oxide-semiconductor transistor formed therein and thereon;
   forming bottom electrode of said apparatus on said field oxide region wherein said bottom electrode comprises polycide;
   forming an interlevel dielectric layer on said bottom electrode; and
   forming top electrode of said apparatus on said interlevel dielectric layer by using damascene technology.

2. The method according to claim 1, wherein said bottom electrode is formed by using depositing a polysilicon layer and then salicide process.

3. The method according to claim 1, wherein said damascene technology comprising:
   etching back a portion of said interlevel dielectric layer over said bottom electrode;
   depositing a metal layer on said interlevel dielectric layer; and
   etching excess metal layer over said interlevel dielectric layer.

4. The method according to claim 3, further comprising a barrier metal deposited before metal deposition.

5. The method according to claim 1, further comprising a step of depositing a dielectric layer after etching back said interlevel dielectric layer, wherein said dielectric layer is formed by using chemical vapor deposition method and is selected from the group consisting of silicon oxide, silicon nitride, silicon oxynitride, and tantalum oxide.

6. A method for forming an embedded capacitor in logic circuits, said method comprising:
   providing a substrate with a field oxide region adjacent to a metal-oxide-semiconductor transistor formed therein and thereon;
   forming bottom electrode of the capacitor on said field oxide region, wherein said bottom electrode comprises polycide;
   depositing an interlevel dielectric layer on said semiconductor device;
   etching back a portion of said interlevel dielectric layer;
   forming dielectric layer of the capacitor on said bottom electrode;
   depositing metal layer on said dielectric layer; and
   etching back excess said metal layer over said interlevel dielectric layer.

7. The method according to claim 6, wherein said bottom electrode is formed by using depositing a polysilicon layer and then salicide process.

8. The method according to claim 6, further comprising a barrier metal deposited before metal deposition.

9. A method for forming a semiconductor device, said semiconductor device comprising an embedded capacitor in logic circuits, said method comprising:
   providing a substrate having a metal-oxide-semiconductor field effect transistor formed in and on;
   forming bottom electrode of the capacitor on a field oxide region adjacent to said transistor, wherein said bottom electrode comprises polycide;
   depositing a first interlevel dielectric layer on said semiconductor device;
   etching back a portion of said interlevel dielectric layer;
   forming dielectric layer of the capacitor on said bottom electrode;
   depositing a metal layer on said dielectric layer;
   etching back excess said metal layer over said interlevel dielectric layer;
   depositing a second interlevel dielectric layer on said semiconductor device; and
   forming contact in said interlevel dielectric layers.

10. The method according to claim 9, wherein said bottom electrode is formed by using depositing polysilicon and then salicide process.

11. The method according to claim 9, further comprising a barrier metal deposited before metal deposition.

12. A method for forming embedded capacitor in logic circuits, said method comprising:
   providing a substrate with an active area adjacent to a field isolation region, wherein a silicon oxide layer is formed thermally on said active area;
   depositing a polysilicon layer on said substrate;
   transferring a gate pattern and a first electrode pattern into said polysilicon layer to form a gate electrode on said active area and a first electrode of a capacitor on said field isolation region;
   forming a source region and a drain region adjacent to said gate electrode in said active area to complete a metal-oxide-semiconductor transistor;
   performing a salicide process on said first electrode and said transistor;
   depositing a first interlevel dielectric layer on said substrate to cover said transistor and said first electrode;
   removing a portion of said first interlevel dielectric layer on said first electrode to form a recess region;
   depositing a metal layer into said recess region; and
   removing excess metal layer over said first interlevel layer using chemical mechanical polishing method to form a second electrode of said capacitor.

13. The method according to claim 12, wherein said transistor further comprises spacers on sidewall of said gate electrode.

14. The method according to claim 13, wherein said transistor comprises a channel region under said gate electrode in said active area.

15. The method according to claim 14, wherein said transistor further comprises lightly-doped drain region under said spacers between said source/drain regions and said channel region in said active area.

16. The method according to claim 12, wherein said metal layer comprises tungsten.

17. The method according to claim 12, further comprising a step of depositing a conformal dielectric layer into said recess region as a dielectric layer of said capacitor before depositing said metal layer.

18. The method according to claim 17, wherein said conformal dielectric layer is selected from the group consisting of silicon oxide, silicon nitride, silicon oxynitride, and tantalum oxide.

19. The method according to claim 17, further comprising a step of depositing a barrier layer into said recess region after depositing said conformal dielectric layer.

20. The method according to claim 19, wherein said barrier layer comprises titanium and titanium nitride.

21. The method according to claim 17, further comprising following steps:
- depositing a blanket second interlevel dielectric layer on said first interlevel dielectric layer; and
- forming a plurality of contacts in said first and second interlevel dielectric layer to contact said source/drain regions, said first electrode, and said second electrode.

\* \* \* \* \*